United States Patent
Xing et al.

(10) Patent No.: US 11,790,968 B2
(45) Date of Patent: Oct. 17, 2023

(54) SPINTRONIC DEVICE, SOT-MRAM STORAGE CELL, STORAGE ARRAY AND IN-MEMORY COMPUTING CIRCUIT

(71) Applicant: INSTITUTE OF MICROELECTRONICS OF THE CHINESE ACADEMY OF SCIENCES, Beijing (CN)

(72) Inventors: Guozhong Xing, Beijing (CN); Huai Lin, Beijing (CN); Cheng Lu, Beijing (CN); Qi Liu, Beijing (CN); Hangbing Lv, Beijing (CN); Ling Li, Beijing (CN); Ming Liu, Beijing (CN)

(73) Assignee: INSTITUTE OF MICROELECTRONICS OF THE CHINESE ACADEMY OF SCIENCES, Beijing (CN)

( * ) Notice: Subject to any disclaimer, the term of this patent is extended or adjusted under 35 U.S.C. 154(b) by 196 days.

(21) Appl. No.: 17/594,684

(22) PCT Filed: Aug. 7, 2020

(86) PCT No.: PCT/CN2020/107726
§ 371 (c)(1),
(2) Date: Oct. 26, 2021

(87) PCT Pub. No.: WO2022/016626
PCT Pub. Date: Jan. 27, 2022

(65) Prior Publication Data
US 2022/0310146 A1    Sep. 29, 2022

(30) Foreign Application Priority Data

Jul. 21, 2020 (CN) .......................... 202010704837.X

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1655* (2013.01); *G11C 11/1657* (2013.01);
(Continued)

(58) Field of Classification Search
None
See application file for complete search history.

(56) References Cited

U.S. PATENT DOCUMENTS

2018/0358542 A1* 12/2018 Mihajlovic ......... G11C 11/1673
2020/0135804 A1*  4/2020 Luo ........................ H10N 50/01
(Continued)

*Primary Examiner* — Tan T. Nguyen
(74) *Attorney, Agent, or Firm* — Platinum Intellectual Property

(57) ABSTRACT

The disclosure provides a spintronic device, a SOT-MRAM storage cell, a storage array and a in-memory computing circuit. The spintronic device includes a ferroelectric/ferromagnetic heterostructure, a magnetic tunnel junction, and a heavy metal layer between the ferroelectric/ferromagnetic heterostructure and the magnetic tunnel junction; the ferroelectric/ferromagnetic heterostructure includes a multiferroic material layer and a ferromagnetic layer arranged in a stacked manner, and the magnetic tunnel junction includes a free layer, an insulating layer and a reference layer arranged in a stacked manner, and the heavy metal layer is disposed between the ferromagnetic layer and the free layer. According to one or more embodiments of the disclosure, the spintronic device, the SOT-MRAM storage cell, the storage array and the in-memory computing circuit can realize deterministic magnetization inversion under the condition of no applied field assistance.

14 Claims, 7 Drawing Sheets

(51) Int. Cl.
    *H10N 50/10*     (2023.01)
    *H10N 50/80*     (2023.01)
    *H10N 50/85*     (2023.01)

(52) U.S. Cl.
    CPC ...... *G11C 11/1673* (2013.01); *G11C 11/1675* (2013.01); *H10B 61/22* (2023.02); *H10N 50/10* (2023.02); *H10N 50/80* (2023.02); *H10N 50/85* (2023.02)

(56) References Cited

U.S. PATENT DOCUMENTS

2020/0136016 A1*   4/2020   Lin .................... G11C 11/161
2022/0109100 A1*   4/2022   Lee .................... H10N 50/85

\* cited by examiner

SPINTRONIC DEVICE, SOT-MRAM STORAGE CELL, STORAGE ARRAY AND IN-MEMORY COMPUTING CIRCUIT

CROSS-REFERENCES TO RELATED APPLICATIONS

This application is a United States National Stage Application filed under 35 U.S.C 371 of PCT Patent Application Serial No. PCT/CN2020/107726, filed Aug. 7, 2020, which claims the priority of a Chinese patent application number 202010704837.X filed on Jul. 21, 2020, entitled "Spintronic Device, SOT-MRAM Storage Cell, Storage Array And In-Memory Computing Circuit", the entirety of which is incorporated herein by reference.

TECHNICAL FIELD

The disclosure belongs to the field of integrated circuit technology, and in particular to a spintronic device, a SOT-MRAM storage cell, a storage array and a in-memory computing circuit.

BACKGROUND OF THE INVENTION

Among various current novel non-volatile memories, spintronic devices have the advantages of high speed, low energy consumption, fatigue resistance, radiation resistance, easy miniaturization and the like, making them attract wide attention in the information field worldwide. Magnetic Random Access Memory (MRAM) based on Magnetic Tunnel Junction (MTJ) is a spintronic device that has attracted the most attention. The second-generation MRAM, which is currently being actively developed, is realized by using the Spin Transfer Torque (STT) effect. In the information writing process of STT-MRAM, a large current is required to pass through the magnetic tunnel junction, so the information writing process is accompanied by high energy consumption and is not conducive to device stability. In contrast, when the Spin-Orbit Torque (SOT, Spin-Orbit Torque) effect is used to reverse a magnetic free layer, there is no need for a large current to pass through the magnetic tunnel junction when writing information, which can realize the separation of information reading and writing, and greatly improves device stability. SOT-MRAM also has a faster magnetization inversion speed and lower inversion critical current density than STT-MRAM, which helps to achieve storage and calculation of data under ultra-low energy consumption, thereby rendering the third-generation magnetic random access memory SOT-MRAM a broad application prospect in the fields of magnetic storage-calculating integration, magnetic artificial-intelligence and the like.

Although the spin-orbit torque is expected to solve bottlenecks of speed, energy consumption, and barrier reliability faced by the spin transfer torque, for a magnetic tunnel junction of perpendicular magnetic anisotropy, a separate spin-orbit torque alone cannot realize deterministic directional magnetization inversion. Under the action of an effective magnetic field, the magnetization is equivalent in two states of vertical upward direction and vertical downward direction, and a horizontal magnetic field must be applied along the current direction to destroy this symmetry in order to achieve a deterministic magnetization inversion. The introduction of an applied magnetic field increases the complexity and reliability risks of the circuit, making it impossible to effectively realize miniature integration, and also reducing stability of a ferromagnetic layer, which has become the biggest obstacle to limit the application of spin-orbit torque. How to enable the spin-orbit torque to achieve a deterministic magnetization inversion under the condition of no applied magnetic field and realize the integration application compatible with the existing CMOS process is still a technical problem to be solved urgently in this field.

SUMMARY OF THE INVENTION

In view of the problems in the existing technology, the disclosure provides a spintronic device, a SOT-MRAM storage cell, a storage array and a in-memory computing circuit, which are used to solve the problem that the existing spin-orbit torque cannot achieve a deterministic magnetization inversion under the condition of no applied magnetic field and cannot realize integration application compatible with the existing CMOS process.

In a first aspect of the disclosure, a spintronic device is provided, including a ferroelectric/ferromagnetic heterostructure, a magnetic tunnel junction and a heavy metal layer disposed between the ferroelectric/ferromagnetic heterostructure and the magnetic tunnel junction; the ferroelectric/ferromagnetic heterostructure includes a multiferroic material layer and a ferromagnetic layer arranged in a stacked manner, and the magnetic tunnel junction includes a free layer, an insulating layer, and a reference layer arranged in a stacked manner, and the heavy metal layer is disposed between the ferromagnetic layer and the free layer.

In some embodiments of the disclosure, a material of the multiferroic material layer is $La_xBi_{1-x}FeO_3$ or $BiFeO_3$, and a material of the ferromagnetic layer is CoFe.

In some embodiments of the disclosure, a material of the heavy metal layer is W, Pt or Ta.

In some embodiments of the disclosure, a material of the free layer is one of FeCo, FeNi, FePd, FePt, CoPd, and FeCoB or a Heusler compound, a material of the insulating layer is MgO or $AlO_x$, and a material of the reference layer is one of FeCo, FeNi, FePd, FePt, CoPd, and FeCoB or a Heusler compound.

In some embodiments of the disclosure, the ferroelectric/ferromagnetic heterostructure and the magnetic tunnel junction are both cylindrical structures, and the heavy metal layer is a strip-shaped structure.

In some embodiments of the disclosure, the spintronic device further includes a first electrode, a second electrode, a third electrode and a fourth electrode; the first electrode is connected to the multiferroic material layer, and the second electrode is connected to the reference layer, and the third electrode is connected to an end of the heavy metal layer, and the fourth electrode is connected to another end of the heavy metal layer; an end of the heavy metal layer and another end of the heavy metal layer being oppositely arranged.

In a second aspect of the disclosure, a SOT-MRAM storage cell is provided, including a first transistor, a second transistor, and the above-mentioned spintronic device; an end of the first transistor and the multiferroic material layer are used to connect a write bit line, and another end of the first transistor is connected to an end of the heavy metal layer, and a control end of the first transistor is used to connect a write word line; an end of the second transistor is used to connect a read bit line, and another end of the second transistor is connected to the reference layer, and a control end of the second transistor is used to connect a read word line; and another end of the heavy metal layer is used to connect a source line, another end of the heavy metal layer and an end of the heavy metal layer being oppositely arranged.

In a third aspect of the disclosure, a in-memory computing circuit is provided, including a first storage cell, a second storage cell, a first reference unit and a first sense amplifier, the first storage cell and the second storage cell are the above-mentioned SOT-MRAM storage cells; the first reference unit is used to provide a first reference voltage, and an input end of the first sense amplifier is used to receive the first reference voltage, and another input end of the first sense amplifier is connected to a read bit line connected to the first storage cell and a read bit line connected to the second storage cell, and an output end of the first sense amplifier is used as an output end of the in-memory computing circuit.

In some embodiments of the disclosure, the first reference unit includes a first reference resistor; an end of the first reference resistor is connected to an input end of the first sense amplifier and used to receive a first reference current, and another end of the first reference resistor is grounded.

In some embodiments of the disclosure, the first storage cell and the second storage cell are connected to a same write word line, and the first storage cell and the second storage cell are connected to a same source line, and the first storage cell and the second storage cell are connected to a same read bit line.

In a fourth aspect of the disclosure, a storage array is provided, including M write bit lines, M read bit lines, N write word lines, N read word lines, N source lines, and M rows and N columns of storage cells, wherein the storage cells are the SOT-MRAM storage cells as claimed in claim 7, M and N being positive integers; and each storage cell located in a same row is connected to a same write bit line, and each storage cell located in a same row is connected to a same read bit line, and each storage cell located in a same column is connected to a same write word line, and each storage cell located in a same column is connected to a same read word line, and each storage cell located in a same column is connected to a same source line.

In the fifth aspect of the disclosure, another in-memory computing circuit is provided, including a bit line decoder, a word line decoder, a source line decoder, a read operation module and the above-mentioned storage array; the bit line decoder is used to provide a bit line operation voltage to the M write bit lines and the M read bit lines; the word line decoder is used to provide a word line operation voltage to the N write word lines and the N read word lines; the source line decoder is used to provide a source line operation voltage and an induced current to the N source lines; and the read operation module is used to read data stored in the storage array and perform a logical operation on the data stored in the storage array.

In some embodiments of the disclosure, the read operation module includes a second reference unit, a third reference unit, a second sense amplifier, a third sense amplifier, and an output unit; the second reference unit is used to provide a second reference voltage when performing a read operation on the storage array or when performing a logical OR operation on the storage array; the third reference unit is used to provide a third reference voltage when performing a logical AND operation on the storage array; an input end of the second sense amplifier is used to receive the second reference voltage, and another input end of the second sense amplifier is connected to the M read bit lines, and an output end of the second sense amplifier is connected to the output unit; an input end of the third sense amplifier is used to receive the third reference voltage, and another input end of the second third sense amplifier is connected to the M read bit lines, and an output end of the third amplifier is connected to the output unit; and an output end of the output unit is used as an output end of the in-memory computing circuit.

In some embodiments of the disclosure, the second reference unit includes a second reference resistor, a third reference resistor, a third transistor, and a fourth transistor; an end of the second reference resistor is connected to an end of the third reference resistor and an input end of the second sense amplifier and is used to receive a second reference current, and another end of the second reference resistor is connected to an end of the third transistor, and another end of the third reference resistor is connected to an end of the fourth transistor, and a control end of the third transistor is used to receive a first enable signal, and a control end of the fourth transistor is used to receive a second enable signal, and another end of the third transistor and another end of the fourth transistor are grounded.

In some embodiments of the disclosure, the third reference unit includes a fourth reference resistor and a fifth transistor; an end of the fourth reference resistor is connected to an input end of the third sense amplifier and used to receive a third reference current, and another end of the fourth reference resistor is connected to an end of the fifth transistor, and a control end of the fifth transistor is used to receive a third enable signal, and another end of the fifth transistor is grounded.

In some embodiments of the disclosure, the read operation module further includes a NAND circuit and a NOT circuit; an input end of the NAND circuit is connected to an output end of the second sense amplifier, and another input end of the NAND circuit is connected to an output end of the third sense amplifier, and an output end of the NAND circuit is connected to the output unit and an input end of the NOT circuit, and an output end of the NOT circuit is connected to the output unit.

A spintronic device according to one or more embodiments of the disclosure includes a ferroelectric/ferromagnetic heterostructure, a magnetic tunnel junction, and a heavy metal layer disposed between the ferroelectric/ferromagnetic heterostructure and the magnetic tunnel junction. Since there is an interface exchange coupling effect between adjacent multiferroic material layer and ferromagnetic layer in the ferroelectric/ferromagnetic heterostructure, the ferromagnetic layer can generate magnetization related to the ferroelectric polarization of the multiferroic material layer and thus generating an interface magnetic field. Therefore, by applying an electric field to the spintronic device to control a ferroelectric switch of the ferromagnetic layer, the generation and disappearance of the interface magnetic field can be controlled. Further, in the magnetic tunnel junction, the deterministic inversion of the magnetization direction of the free layer can be controlled by enhancing the SOT, by the interface magnetic field generated by the ferroelectric/ferromagnetic heterostructure and the inter-layer coupling, so as to drive free layer magnetization inversion effect. Therefore, the spintronic device of one or more embodiments of the disclosure can realize deterministic magnetization inversion under the condition of no applied field assistance. In addition, in the spintronic device of one or more embodiments of the disclosure, the magnetization direction of the free layer can be reversed with a small write current, and the write current does not pass through the magnetic tunnel junction, reducing the damage caused by the write current to the magnetic tunnel junction, improving anti-fatigue cycle characteristic, so it also has a low critical current density, a high data write rate, and a high anti-fatigue cycle characteristic. In addition, the spintronic device of one or more embodiments of the disclosure is compatible in structure with the existing magnetic tunnel junction-based device, which facilitates the large-scale manufacturing of the spintronic device.

The in-memory computing circuit according to one or more embodiments of the disclosure can realize the access of the storage array and the Boolean logic operation of the stored data, realizing the integrated storage-calculating function, and is compatible with the existing CMOS integrated circuit technology and thus is conducive to large-scale manufacture and integration applications.

BRIEF DESCRIPTION OF THE DRAWINGS

By reading the detailed description of the preferred embodiments below, various other advantages and benefits will become clear to those of ordinary skill in the art. The drawings are only used for the purpose of illustrating the preferred embodiments, and are not considered as a limitation to the disclosure. Also, throughout the drawings, the same reference numerals are used to denote the same components. In the attached drawings.

DETAILED DESCRIPTION OF THE INVENTION

Figure 1:
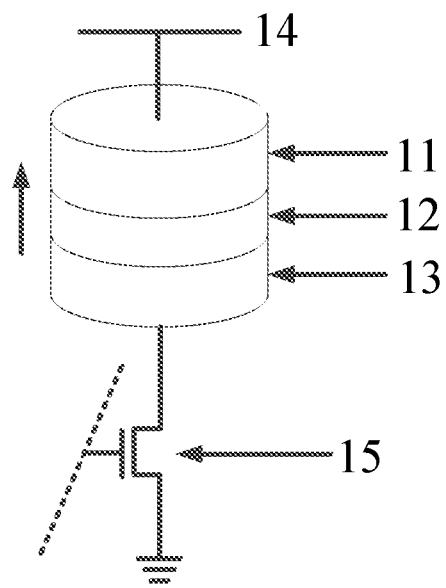
FIG. 1 is a schematic structural diagram of an existing STT-MRAM storage cell.

FIG. 1 is a schematic structural diagram of an existing STT-MRAM storage cell. The STT-MRAM storage cell includes a strobe transistor 15 disposed between a bit line 14 and a word line, and a magnetic tunnel junction. The magnetic tunnel junction includes a reference layer 11, an insulating layer 12 and a free layer 13 that are stacked together. When the strobe transistor 15 is turned on, the magnetic tunnel junction is conducted, and the electrons in the bit line 14 are injected into the reference layer 11, generating a spin current with a same polarization direction of the reference layer 11. The spin current transitions through the insulating layer 12 to transfer a spin torque to the free layer, thereby flipping a magnetization direction of the free layer to be the same as a magnetization direction of the reference layer 11, at which point the magnetic tunnel junction presents a low resistance state, and the purpose of writing binary data "0" is achieved. When a current with an opposite direction is applied to the STT-MRAM storage cell, electrons flow into the reference layer 11 from the free layer, and polarized electrons opposite to a spin direction of the reference layer 11 are reflected, causing a magnetization direction of the free layer is reversed to be opposite to a magnetization direction of the reference layer 11, at which point the magnetic tunnel junction presents a high resistance state, and the purpose of writing binary data "1" is achieved. For the STT-MRAM storage cell, a relatively large current is required to pass through the magnetic tunnel junction in order to achieve the above-mentioned data writing process. Therefore, the information writing process is accompanied by high energy consumption and is not conducive to device stability.

Figure 2:
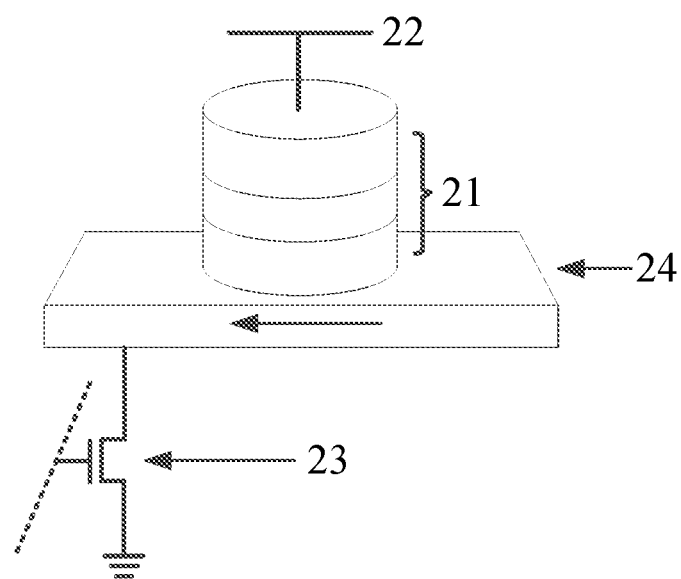
FIG. 2 is a schematic structural diagram of an existing SOT-MRAM storage cell.

FIG. 2 is a schematic diagram of the structure of an existing SOT-MRAM storage cell. The SOT-MRAM storage cell includes a magnetic tunnel junction 21 disposed between a bit line 22 and a word line, a heavy metal layer 24 and a strobe transistor 23. The magnetic tunnel junction includes a reference layer, an insulating layer, and a free layer that are stacked together. When the strobe transistor 23 is turned on, the magnetic tunnel junction 21 is conducted, generating a current flowing through the heavy metal layer 24. Due to the spin Hall effect, the current flowing through the heavy metal layer 24 generates two polarized currents in opposite directions. Spin-polarized electrons accumulate on an edge of the heavy metal layer 24, and a spin current is generated injecting into the free layer. Under the action of an external magnetic field, the spin current generates a torque on a magnetization in the free layer and the reference layer, inducing the deterministic magnetization inversion of the free layer and the reference layer. When a magnetization direction of the free layer is the same as a magnetization direction of the reference layer, the magnetic tunnel junction 21 presents a low resistance state, corresponding to writing binary data "0"; when a magnetization direction of the free layer is opposite to a magnetization direction of the reference layer, the magnetic tunnel junction 21 presents a high resistance state, corresponding to writing binary data "1". For the SOT-MRAM storage cell, the introduction of an external magnetic field increases circuit complexity and reliability risks, which causes a difficult miniaturization and integration and reduces the stability of the free layer and the reference layer, thereby becoming a biggest obstacle to the application of the spin-orbit torque.

In view of this, the spintronic device according to one or more embodiments of the disclosure utilizes magnetoelectric coupling principle to apply an external electric field to the magnetoelectric coupling heterojunction, so as to realize a fully electrical control of directional magnetization inversion at room temperature.

Hereinafter, exemplary embodiments of the disclosure will be described in more detail with reference to the accompanying drawings. Although the drawings show exemplary embodiments of the disclosure, it should be understood that the disclosure can be implemented in various forms and should not be limited by the embodiments described herein. On the contrary, these embodiments are provided to enable a more complete understanding of the disclosure and to fully convey the scope of the disclosure to those skilled in the art.

The technical solutions of the disclosure will be further described in detail below through the accompanying drawings and specific embodiments.

Figure 3:
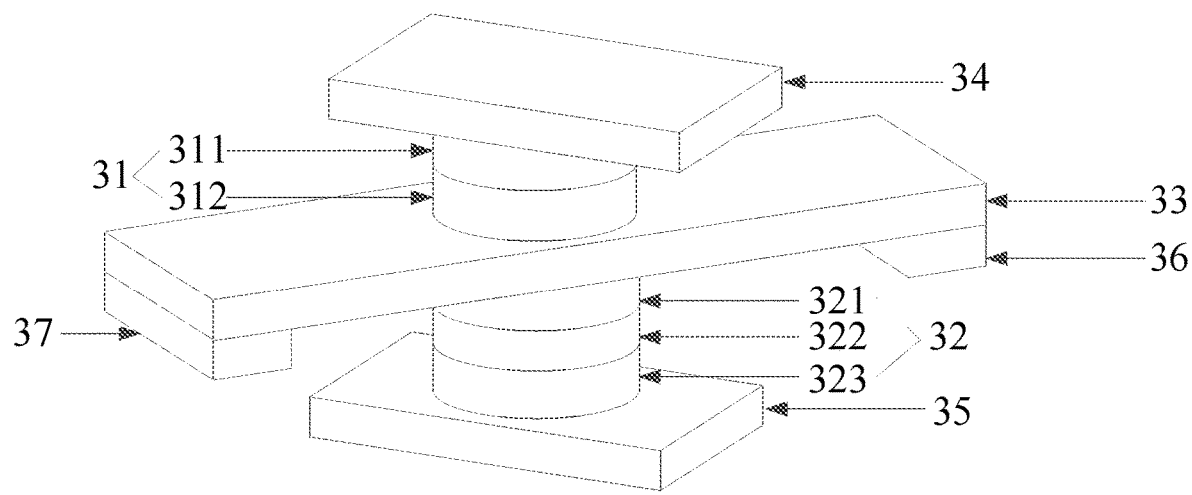
FIG. 3 is a schematic structural diagram of a spintronic device according to some embodiments of the disclosure.

In the first aspect of the disclosure, a spintronic device is provided. FIG. 3 is a schematic structural diagram of the spintronic device. The spintronic device includes a ferroelectric/ferromagnetic heterostructure 31, a magnetic tunnel junction 32 and a heavy metal layer 33 disposed between the ferroelectric/ferromagnetic heterostructure 31 and the magnetic tunnel junction 32. The ferroelectric/ferromagnetic heterostructure 31 includes a multiferroic material layer 311 and a ferromagnetic layer 312 stacked together, and the magnetic tunnel junction 32 includes a free layer 321, an insulating layer 322 and a reference layer 323 stacked together, the heavy metal layer 33 is disposed between the ferromagnetic layer 312 and the free layer 321.

The multiferroic material layer 311 has ferromagnetic and ferroelectric properties at room temperature, and can couple the intrinsic ferroelectricity and ferromagnetism under the control of an applied electric field. At the same time, an interface exchange coupling effect exists between the multiferroic material layer 311 and the ferromagnetic layer 312. When the applied electric field breaks through time inversion symmetry, the multiferroic material layer 311 and the ferromagnetic layer 312 exhibit an interface magnetic field. At this time, if a current flows through the heavy metal layer 33, the heavy metal layer 33 generates a spin current, and an interface magnetic field generated by a magnetoelectric coupling replaces an applied magnetic field, thereby realizing deterministic writing of information storage.

Figure 4:
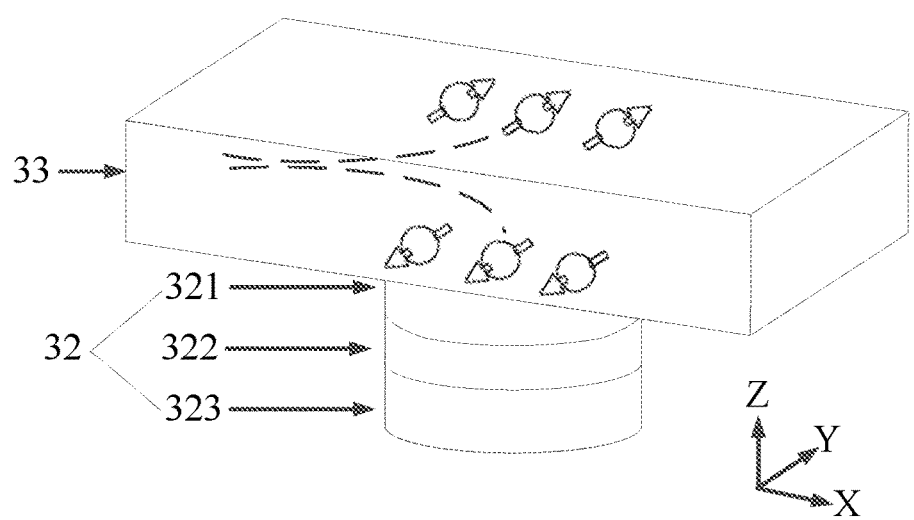
FIG. 4 is a schematic structural diagram of an information storage portion of a spintronic device according to some embodiments of the disclosure.

FIG. 4 is a schematic structural diagram of an information storage portion of a spintronic device according to some embodiments of the disclosure. Referring to FIG. 4, the magnetic tunnel junction 32 and the heavy metal layer 33 constitute an information storage portion of the spintronic device. Due to the spin Hall effect, when a current flows through the heavy metal layer 33, a polarization current opposite to a spin direction is generated in the heavy metal layer 33, and the polarization current accumulates in a Z-axis direction. The Z-axis direction is a direction perpendicular to the plane where the heavy metal layer 33 is located, and a Z-axis positive direction is a direction pointing to the ferroelectric/ferromagnetic heterostructure 31, and a Z-axis negative direction is a direction pointing to the magnetic tunnel junction 32. In the Z-axis negative direction, a spin current is injected into the free layer 321. Under the action of an interface magnetic field generated by the ferroelectric/ferromagnetic heterostructure 31, the free layer 321 generates a directional magnetization inversion. When a magnetization direction of the free layer 321 is the same as the magnetization direction of the reference layer 323, the magnetic tunnel junction 32 presents a low resistance state, representing a storage of binary data "0"; when a magnetization direction of the free layer 321 is opposite to the magnetization direction of the reference layer 323, the magnetic tunnel junction 32 presents a high resistance state, representing a storage of binary data "1".

The material and thickness of the magnetic tunnel junction 32 and the heavy metal layer 33 can be selected according to actual application scenarios. In some embodiments, a material of the heavy metal layer 33 may be a strong spin-orbit coupling thin film such as W, Pt, or Ta, and a thickness of the heavy metal layer 33 may be 1 nm to 10 nm. A material of the free layer 321 may be one of FeCo, FeNi, FePd, FePt, CoPd, and FeCoB or a Heusler compound, and a thickness of the free layer 321 may be 1 nm to 2 nm. A material of the insulating layer 322 may be a high-quality tunneling film such as MgO or $AlO_x$, and a thickness of the insulating layer 322 may be 0.8 nm to 1.6 nm. A material of the reference layer 323 may be one of FeCo, FeNi, FePd, FePt, CoPd, and FeCoB or a Heusler compound, and a thickness of the reference layer 323 may be 1 nm to 2 nm.

Figure 5:
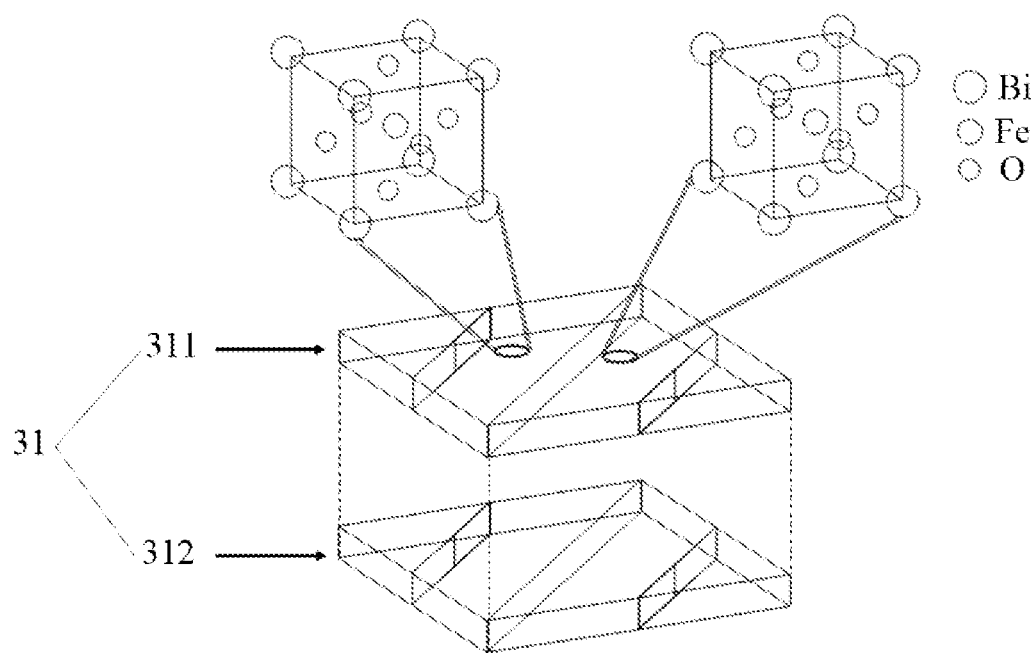
FIG. 5 is a schematic structural diagram of a ferroelectric/ferromagnetic heterostructure of a spintronic device according to some embodiments of the disclosure.

FIG. 5 is a schematic structural diagram of a ferroelectric/ferromagnetic heterostructure of a spintronic device according to some embodiments of the disclosure. Referring to FIG. 5, the multiferroic material layer 311 and the ferromagnetic layer 312 constitute a heterogeneous structure. The multiferroic material layer 311 has ferromagnetic and ferroelectric properties at room temperature, and the ferromagnetic layer 312 has a smaller magnetostriction coefficient. Due to the inherent magnetoelectric coupling, a material will generate a magnetic torque that is the same as and orthogonal to the plane projection direction of the ferroelectric polarization. Therefore, by applying an electric field, a magnetization of the material can be achieved. An interface exchange coupling between the multiferroic material layer 311 and the ferromagnetic layer 312 is generated, thereby coupling a magnetic torque of the ferromagnetic layer 312 with a magnetic ordering of the multiferroic material layer 311, and an anisotropy and a crystal domain structure can be transferred to the ferromagnetic layer 312 through exchange coupling, generating an interface magnetic field. Since a switch magnetized in the ferroelectric/ferromagnetic heterostructure 31 is controlled by a ferroelectric switch of the multiferroic material layer 311, energy dissipation caused by Joule heat can be eliminated.

A material and thickness of the multiferroic material layer 311 and the ferromagnetic layer 312 can be selected according to actual application scenarios. In some embodiments, a material of the multiferroic material layer 311 can be a single-phase multiferroic material, for example, a ferroelectric thin film such as $La_xBi_{1-x}FeO_3$ or $BiFeO_3$, and a thickness of the multiferroic material layer 311 can be 2.5 nm to 4 nm. Both magnetic ordering and ferroelectric ordering can coexist in the single-phase multiferroic material at room temperature, which provides a prerequisite for controlling an inversion of ferromagnet at room temperature. A material of the ferromagnetic layer 312 may be a single-phase multiferroic and ferromagnetic transition metal material, for example, a ferromagnetic thin film such as CoFe, and a thickness of the ferromagnetic layer 312 may be 2.5 nm to 4 nm. A heterojunction composed of a single-phase multiferroic and a ferromagnetic transition metal material and single-phase multiferroic material can generate an exchange coupling effect among layers, and a magnetization intensity in each ferromagnetic domain is collinear with a plane projection direction of the corresponding ferroelectric domain polarization in the single-phase multiferroic material, meaning that the magnetization of the ferromagnet can be controlled by the ferroelectric switch range of the multiferroic system.

In some embodiments, the ferroelectric/ferromagnetic heterostructure 31, the magnetic tunnel junction 32 and the heavy metal layer 33 constitute a stacked structure. Such a design allows a read-write operation to be performed on the same structure, and only a small current and an applied electric field are used to achieve deterministic writing of information. The ferroelectric/ferromagnetic heterostructure 31 and the magnetic tunnel junction 32 may both be cylindrical structures, and the heavy metal layer 33 may be a strip-shaped structure. Of course, the ferroelectric/ferromagnetic heterostructure 31 and the magnetic tunnel junction 32 may also both be other shape stacked structures such as a cuboid structure or an annular structure, which is not limited in the disclosure. The heavy metal layer 33 may also be other shapes such as a square shape, as long as it is ensured that the heavy metal layer 33 has two opposite ends, and when an electric field is applied, current can flow from one end of the heavy metal layer 33 to the opposite end and thus a spin Hall effect can be generated on the heavy metal layer 33.

When the spintronic device is connected to an external circuit, it usually needs to be connected to an external circuit through an electrode. Therefore, the spintronic device may further include a first electrode 34, a second electrode 35, a third electrode 36 and a fourth electrode 37. The first electrode 34 is connected to the multiferroic material layer 311, that is, one bottom surface of the multiferroic material layer 311 is connected to the ferromagnetic layer 312, and another bottom surface of the multiferroic material layer 311 is connected to the first electrode 34. The second electrode 35 is connected to the reference layer 323, that is, one bottom surface of the reference layer 323 is connected to the insulating layer 322, and another bottom surface of the reference layer 323 is connected to the second electrode 35. The third electrode 36 is connected to one end of the heavy metal layer 33, and the fourth electrode 37 is connected to another end of the heavy metal layer 33, and one end of the heavy metal layer 33 and another end of the heavy metal layer 33 are oppositely arranged. In some embodiments, the third electrode 36 and the fourth electrode 37 are disposed on a side of the heavy metal layer 33 connected to the free layer 321. In other embodiments, the third electrode 36 and the fourth electrode 37 may also be disposed on a side of the heavy metal layer 33 connected to the ferromagnetic layer 312, or disposed on a side surface of the heavy metal layer 33, which is not limited in the disclosure. The materials and thicknesses of the first electrode 34, the second electrode 35, the third electrode 36 and the fourth electrode 37 can be selected according to actual application scenarios. In some embodiments, the materials of the first electrode 34, the second electrode 35, the third electrode 36 and the fourth electrode 37 can be Cu, Au, W, Pt, etc. The thickness of the first electrode 34, the second electrode 35, the third electrode 36 and the fourth electrode 37 are nanoscale.

Figure 6:
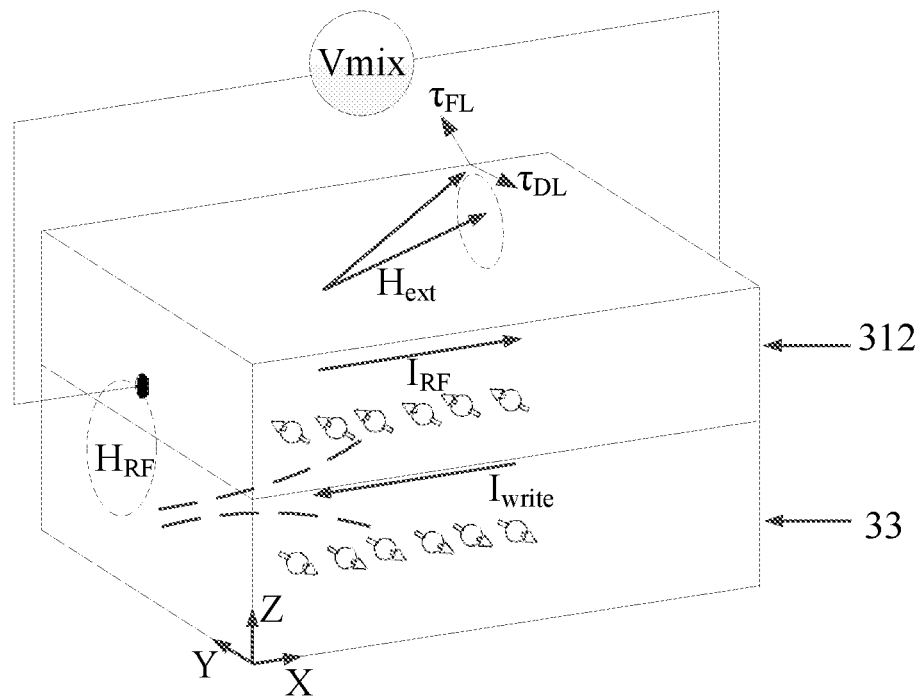
FIG. 6 is a schematic diagram of a spin torque ferromagnetic resonance test performed on a spintronic device according to some embodiments of the disclosure.

FIG. 6 is a schematic diagram of a spin torque ferromagnetic resonance test performed on a spintronic device according to some embodiments of the disclosure. $H_{RF}$ is an applied radio frequency magnetic field, Iwrite is a write current, Hext is an applied magnetic field, M is a magnetization direction, $\tau_{FL}$ is field-like torque generated by a spin current on a ferromagnetic material, and $\tau_{SL}$ is damping-like torque generated by a spin current on a ferromagnetic material, and the two torques work together to reverse a magnetization direction. Spin torque ferromagnetic resonance uses spin torque generated by alternating current to excite ferromagnetic resonance, which is an effective method to measure charge-spin conversion efficiency (i.e., spin Hall angle). An in-plane radio frequency charge flow $I_{RF}$ is injected into the heterostructure of the ferromagnetic layer 312 and the heavy metal layer 33, and due to a spin coupling effect, the heavy metal layer 33 generates a spin current that is injected into the ferromagnetic layer 312 and generates a torque effect on the magnetization of the ferromagnetic layer 312. Since the alternating current is oscillating, the generated oscillation torque also causes oscillation of anisotropic magnetoresistance in the device. Therefore, a hybrid electric voltage Vmix is generated, which is detected by a DC voltmeter or a phase-locked amplifier.

Figure 7:
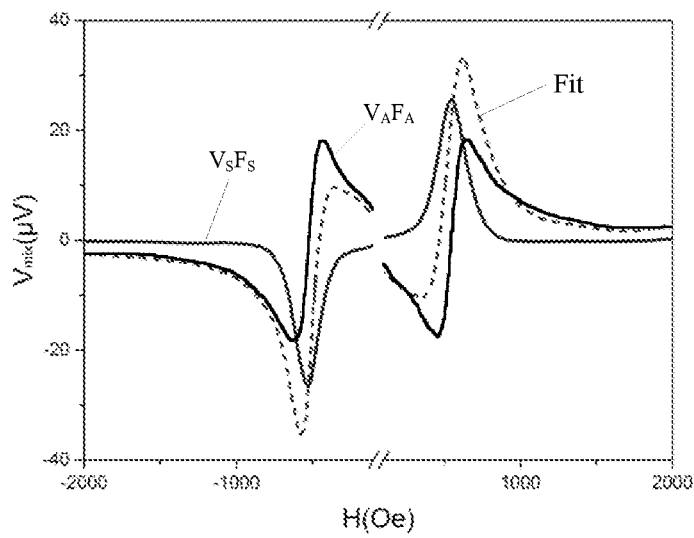
FIG. 7 is a waveform diagram of a hybrid voltage generated by performing a spin-torque ferromagnetic resonance test on a spintronic device according to some embodiments of the disclosure.

FIG. 7 is a waveform diagram of the hybrid voltage Vmix, the dotted line representing a data fitting curve of the spintronic device at a frequency of 6 GHz, the dark curve representing a magnetization result of $\tau_{FL}$ drive in a heterojunction, and the light curve representing a magnetization result of $\tau_{DL}$ drive in the heterojunction. The dark curve has an antisymmetric Lorentz line shape, and the light curve and the dark curve have an additional 90° phase difference. Therefore, in a resonance field, the $\tau_{DL}$ driving torque is in phase (δ=0), resulting in a Lorentz symmetry line shape, where the spin Hall angle (θsh) can be calculated by $V_S/V_A$, and $V_S$ and $F_S$ are measured symmetric Lorentz components, $V_A$ and $F_A$ are anti-symmetric Lorentz components.

A spintronic device of one or more embodiments of the disclosure, by applying an electric field at two ends of ferroelectric/ferromagnetic heterostructure 31, a ferroelectric polarization of the multiferroic material layer 311 is reversed, so as to reverse an antiferromagnetic anisotropy field and an inclined magnetic torque are reversed, and the magnetic coupling effect of the ferroelectric/ferromagnetic heterostructure 31 is adjusted to cause the antiferromagnetic anisotropy field to generate uniaxial anisotropy, thereby changing the coercive field of the ferromagnetic layer 312. This kind of magnetoelectric coupling and inter-layer coupling effect with electric polarization and magnetization generates the magnetic field required to drive the magnetization inversion of the free layer 321, which effectively induces the deterministic inversion of the magnetic tunnel junction 32 in an all-electric operation control and makes deterministic writing of data information possible. The spintronic device can realize the process of an applied field-free auxiliary magnetization inversion, which greatly promotes improvement of miniaturization and integration degree of the device, thereby facilitating actual integration application of the spintronic device. The spintronic device of one or more embodiments of the disclosure has low critical current density, high data write rate, and high fatigue cycle resistance characteristics. In addition, the spintronic device of one or more embodiments of the disclosure is compatible with the existing magnetic tunnel junction-based device in structure, which facilitates large-scale manufacturing of the spintronic device.

Figure 8:
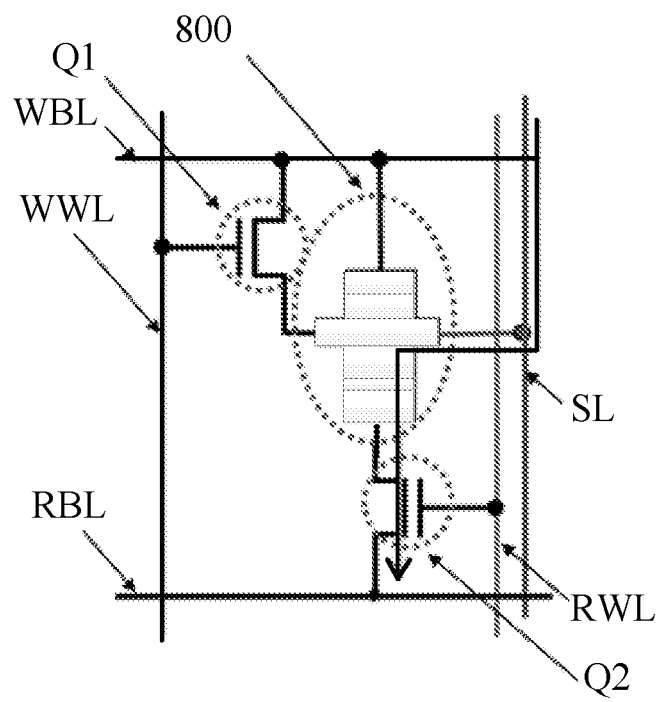
FIG. 8 is a schematic diagram of a circuit structure of a SOT-MRAM storage cell according to some embodiments of the disclosure.

In a second aspect of the disclosure, a SOT-MRAM storage cell is provided. FIG. 8 is a schematic diagram of the circuit structure of the SOT-MRAM storage cell. The SOT-MRAM storage cell includes a first transistor Q1, a second transistor Q2 and a spintronic device 800, the spintronic device 800 is the aforementioned spintronic device.

One end of the first transistor Q1 and the multiferroic material layer of the spintronic device 800 are used to connect a write bit line WBL, and another end of the first transistor Q1 is connected to one end of the heavy metal layer of the spintronic device 800, and a control end of the first transistor Q1 is used to connect a write word line WWL. One end of the second transistor Q2 is used to connect a read bit line RBL, another end of the second transistor Q2 is connected to the reference layer of the spintronic device 800, and a control end of the second transistor Q2 is used to connect a read word line RWL. Another end of the heavy metal layer of the spintronic device 800 is used to connect a source line SL, and another end of the heavy metal layer of the spintronic device 800 is disposed opposite to one end of the heavy metal layer of the spintronic device 800. In some embodiments, the first transistor Q1 and the second transistor Q2 may be NMOS transistors, one end of the first transistor Q1 and one end of the second transistor Q2 are drains of the NMOS transistors, and one end of the first transistor Q1 and another end of the second transistor Q2 are sources of the NMOS transistors, and one end of the first transistor Q1 and a control end of the second transistor Q2 are gates of the NMOS transistors. Of course, the first transistor Q1 and the second transistor Q2 may also be other transistors with switching functions, which are not limited in the disclosure.

When performing a write operation on the SOT-MRAM storage cell, a low-level voltage is applied to the read bit line RBL, the read word line RW, and the source line SL, for example, a 0V voltage is applied to turn off the second transistor Q2; and a high-level voltage is applied to the write bit line WBL and the write word line WWL, for example, a 1.2V voltage is applied to turn on the first transistor Q1, so that a current flows through the heavy metal layer of the spintronic device 800 and generates a spin current in the heavy metal layer of the spintronic device 800, and the spin current is injected into the free layer of the spintronic device 800. Under the action of the magnetic field generated by the ferroelectric/ferromagnetic heterostructure ME of the spintronic device 800, the free layer of the spintronic device 800 generates a directional inversion of the magnetization direction to complete information writing.

Figure 9:
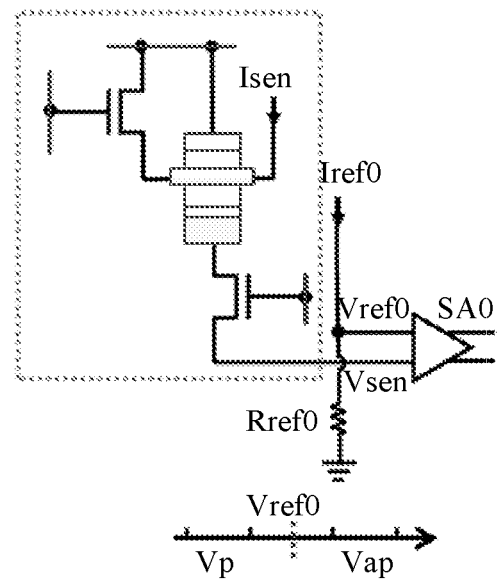
FIG. 9 is a schematic diagram of a circuit structure for performing a read operation on a SOT-MRAM storage cell according to some embodiments of the disclosure.

FIG. 9 is a schematic diagram of a circuit structure for performing a read operation on the SOT-MRAM storage cell. With reference to FIGS. 8 and 9, when performing a read operation on the SOT-MRAM storage cell, a low-level voltage is applied to the write bit line WBL and the write word line WWL, for example, a 0V voltage is applied to turn off the first transistor Q1; and a high-level voltage is applied to the read word line RWL, for example, a voltage of 1.2V is applied, and an induced current Isen is applied to the source line SL, for example, a current of 100 µA to 200 µA is applied to turn on the second transistor Q2 to generate a read current as shown by the arrow path in FIG. 8. The read current causes a corresponding sense voltage Vsen to be generated on the read bit line RBL. The sense voltage Vsen is input to one input end of the read sense amplifier SA0, and another input end of the read sense amplifier SA0 receives the read reference voltage Vref0, wherein the read reference voltage Vref0 is generated by the read reference current Iref0 flowing through the read reference resistor Rref0. The read sense amplifier SA0 compares the sense voltage Vsen with the read reference voltage Vref0, and outputs data stored in the SOT-MRAM storage cell according to the comparison result.

For the SOT-MRAM storage cell, when binary data "0" is stored, a voltage value corresponding to the sense voltage Vsen is Vp; otherwise, when binary data "1" is stored, a voltage value corresponding to the sense voltage Vsen is Vap. By setting a resistance value of the read reference resistor Rref0, a voltage value of the read reference voltage Vref0 is one half of (Vp+Vap). When a voltage value of the sense voltage Vsen is less than a voltage value of the read reference voltage Vref0, the read sense amplifier SA0 outputs a low level, that is, the SOT-MRAM storage cell presents a low resistance state and stores binary data "0".". When a voltage value of the sense voltage Vsen is not less than a voltage value of the read reference voltage Vref0, the read sense amplifier SA0 outputs a high level, that is, the SOT-MRAM storage cell presents a high resistance state and stores binary data "1".

It should be noted that when performing a write operation or a read operation on the SOT-MRAM storage cell, a operation voltage and an induced current applied on the write bit line WBL, the read bit line RBL, the write word line WWL, and the read word line RWL and the source line SL can be set according to actual application scenarios, as long as the above-mentioned write operation or read operation purpose is achieved.

Figure 10:
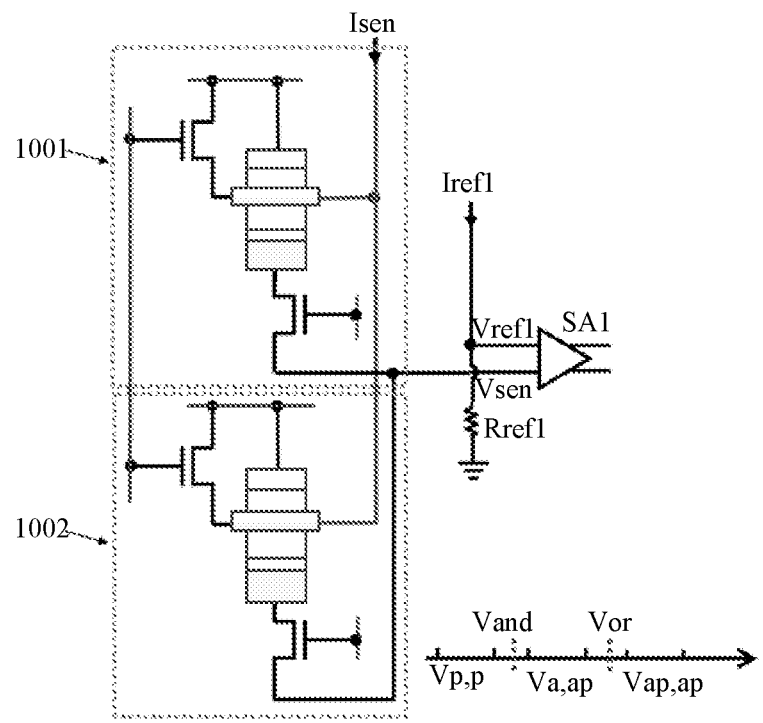
FIG. 10 is a schematic diagram of a circuit structure of a in-memory computing circuit according to some embodiments of the disclosure.

In a third aspect of the disclosure, a in-memory computing circuit is provided, and the in-memory computing circuit is used to implement a logical OR operation and a logical AND operation of two binary data. FIG. 10 is a schematic diagram of the circuit structure of the in-memory computing circuit. The in-memory computing circuit includes a first storage cell 1001, a second storage cell 1002, a first reference unit, and a first sense amplifier SA1, wherein the first storage cell 1001 and the second storage cell 1002 are SOT-MRAM storage cells described in the foregoing embodiments.

The first storage cell 1001 is used to store binary data "0" or binary data "1", and the second storage cell 1002 is used to store binary data "0" or binary data "1". Data stored in the first storage cell 1001 and the second storage cell 1002 may be written in advance in a write operation manner described in the foregoing embodiment. In some embodiments, the first storage cell 1001 and the second storage cell 1002 can be connected to the same write word line, and the first storage cell 1001 and the second storage cell 1002 can be connected to the same source line, and the first storage cell 1001 and the second storage cell 1002 can be connected to the same read bit line. Of course, the first storage cell 1001 and the second storage cell 1002 can also be two mutually independent storage cells, and do not share a write bit line, a read bit line, a write word line, a read word line and a source line. The disclosure is no limitation on this.

The first reference unit is used to provide a first reference voltage Vref1. In some embodiments, the first reference voltage Vref1 includes a first reference resistor Rref1. One end of the first reference resistor Rref1 is connected to an input end of the first sense amplifier SA1 and is used to receive a first reference current Iref1; another end of the first reference resistor Rref1 is grounded, and the first reference current Iref1 flows through the first reference resistor Rref1, and the first reference voltage Vref1 is generated.

One input end of the first sense amplifier SA1 is used to receive the first reference voltage Vref1, and another input end of the first sense amplifier SA1 is connected to a read bit line connected to the first storage cell 1001 and a read bit line connected to the second storage cell 1002, and the output end of the first sense amplifier SA1 is used as an output end of the in-memory computing circuit. The first sense amplifier SA1 compares the voltage on the read bit line connected to the first storage cell 1001 and on the read bit line connected to the second storage cell 1002 with the first reference voltage Vref1, and outputs an operation result of a logical OR operation or a logical AND operation performed on two binary data stored in the first storage cell 1001 and the second storage cell 1002 according to the comparison result.

When performing a logical OR operation or a logical AND operation on two binary data stored in the first storage cell 1001 and the second storage cell 1002, a write bit line and a write word line connected to the first storage cell 1001 and the second storage cell 1002 are applied with a low-level voltage, for example, a 0V voltage is applied to turn off the first transistors in the first storage cell 1001 and the second storage cell 1002; a read word line connected to the first storage cell 1001 and the second storage cell 1002 is applied with a high-level voltage, for example, 1.2V voltage is applied; and a source line connected to the first storage cell 1001 and the second storage cell 1002 is applied with an induced current Isen, for example, a current of 100 μA to 200 μA is applied to turn on the second transistors in the first storage cell 1001 and the second storage cell 1002 and generate a corresponding induced voltage Vsen on a read bit line connected to the first storage cell 1001 and the second storage cell 1002.

For the first storage cell 1001 and the second storage cell 1002, when the first storage cell 1001 and the second storage cell 1002 both store binary data "0", a corresponding voltage value of the induced voltage Vsen is Vp, p; when the first storage cell 1001 and the second storage cell 1002 both store binary data "1", a corresponding voltage value of the induced voltage Vsen is Vap, ap; when the first storage cell 1001 stores binary data "0" and the second storage cell 1002 stores binary data "1", or the first storage cell 1001 stores binary data "1" and the second storage cell 1002 stores binary data "0", a corresponding voltage value of the induced voltage Vsen is Va, ap. By setting a resistance value of the first reference resistor Rref1, a voltage value of the first reference voltage Vref1 is one-half of (Vp, p+Va, ap), it is possible to perform a logical AND operation on the two binary data stored in the first storage cell 1001 and the second storage cell 1002. By setting a resistance value of the first reference resistor Rref1, a voltage value of the first reference voltage Vref1 is one-half of (Vap, ap+Va, ap), it is possible to perform a logical OR operation on the two binary data stored in the first storage cell 1001 and the second storage cell 1002.

In a fourth aspect of the disclosure, there is provided a storage array including M write bit lines, M read bit lines, N write word lines, N read word lines, and N source lines, as well as M rows and N columns of storage cells, where the storage cells are the SOT-MRAM storage cells described above, and M and N are positive integers.

Figure 11:
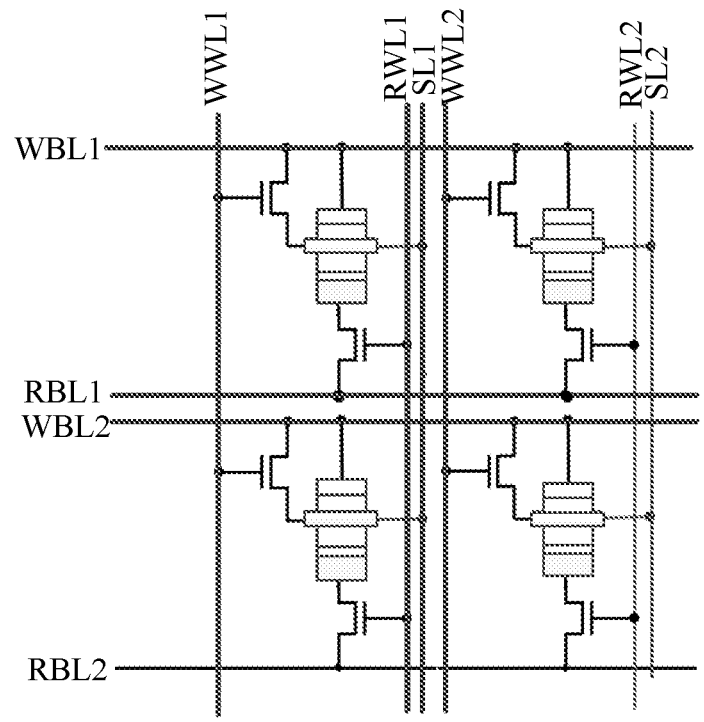
FIG. 11 is a schematic diagram of a circuit structure of a storage array according to some embodiments of the disclosure.

Each storage cell located in a same row is connected to a same write bit line, and each storage cell located in a same row is connected to a same read bit line, and each storage cell located in a same column is connected to a same write word line, and each storage cell located in a same column is connected to a same read word line, and each storage cell located in a same column is connected to a same source line. Taking the values of M and N as 2 as an example, FIG. 11 is a schematic diagram of a circuit structure of a storage array according to some embodiments of the disclosure, in which each storage cell in the first row is connected to a write bit line WBL1, each storage cell in the second row is connected to a write bit line WBL2; each storage cell in the first row is connected to a read bit line RBL1; each storage cell in the second row is connected to a read bit line RBL2; each storage cell in the first column is connected to a write word line WWL1; each storage cell in the second column is connected to a write word line WWL2; each storage cell in the first column is connected to a read word line RWL1; each storage cell in the second column is connected to a read word line RWL2; each storage cell in the first column is connected to a source line SL1, and each storage cell in the second column is connected to a source line SL2.

Figure 12:
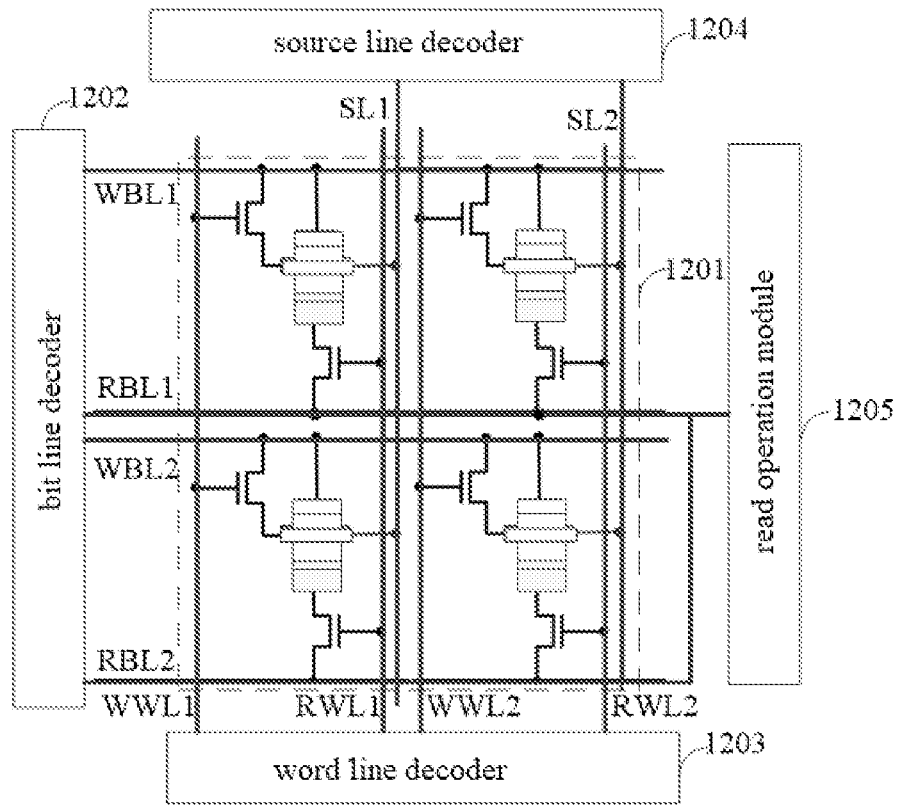
FIG. 12 is a schematic diagram of a circuit structure of a in-memory computing circuit according to some other embodiments of the disclosure; and, FIG. 13 is a schematic diagram of a circuit structure of a read operation module according to some embodiments of the disclosure.

In a fifth aspect of the disclosure, another in-memory computing circuit is provided. FIG. 12 is a schematic diagram of a circuit structure of the in-memory computing circuit. The in-memory computing circuit includes a storage array 1201, a bit line decoder 1202, a word line decoder 1203, a source line decoder 1404, and a read operation module 1205, wherein the storage array 1201 is a aforementioned storage array.

The bit line decoder 1202 is connected to the M write bit lines and the M read bit lines, and is used to provide a bit line Operation voltage to the M write bit lines and the M read bit lines. The word line decoder 1203 is connected to the N write word lines and the N read word lines, and is used to provide a word line operation voltage to the N write word lines and the N read word lines. The source line decoder 1204 is connected to the N source lines, and is used to provide a source line operation voltage and an induced current to the N source lines.

When performing a write operation on the storage array 1201, the bit line decoder 1202 applies a high-level voltage to a write bit line connected to a selected storage cell, and applies a low-level voltage to a write bit line connected to an unselected storage cell and all read bit lines. The word line decoder 1203 applies a high-level voltage to a write word line connected to a selected storage cell, and applies a low-level voltage to a write word line connected to an unselected storage cell and all read word lines; the source line decoder 1204 applies a low-level voltage to all source lines.

When performing a read operation or logical operation on the storage array 1201, the bit line decoder 1202 applies a low-level voltage to all write bit lines; the word line decoder 1203 applies a high-level voltage to a read word line connected to a selected storage cell, and applies a low-level voltage to a read word line connected to an unselected storage cell and all the write word lines; and the source line decoder 1204 applies an induced current to all source lines.

It should be noted that when a write operation or a read operation is performed on the storage array 1201, a storage cell in the storage array 1201 is selected. When performing a Boolean logic operation on the storage array 1201, two storage cells in a column of storage cells in the storage array 1201 are selected.

Figure 13:
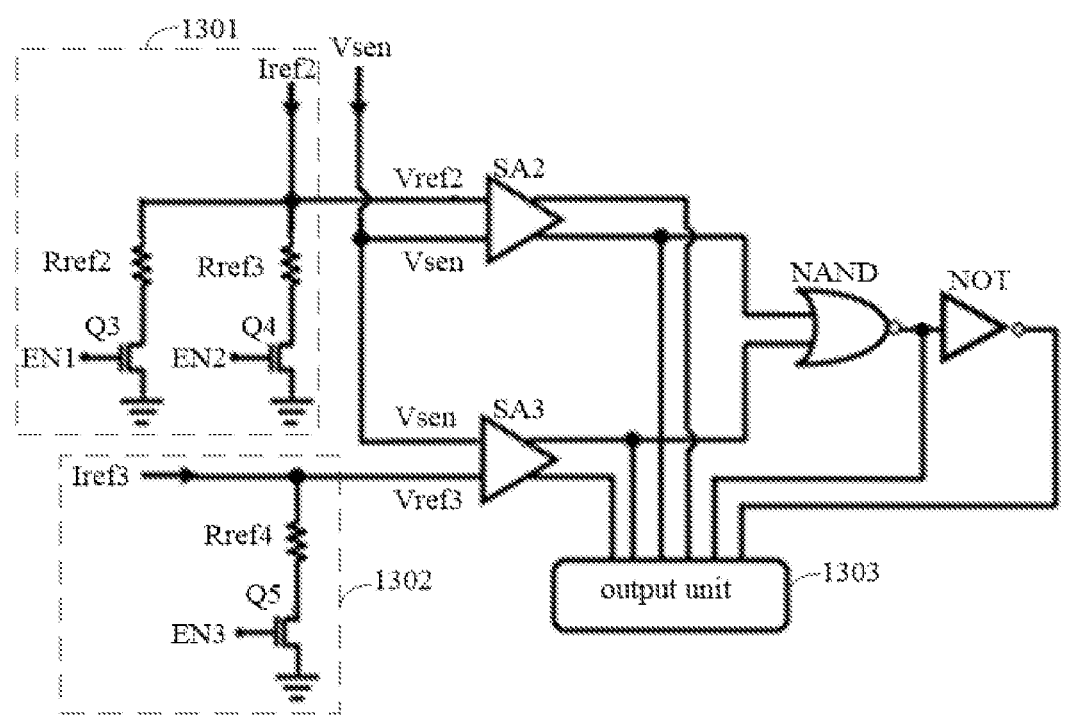

The read operation module 1205 is used to read the data stored in the storage array 1201, and perform a logical operation on the data stored in the storage array 1201. FIG. 13 is a schematic diagram of a circuit structure of a read operation module according to some embodiments of the disclosure. The read operation module 1205 includes a second reference unit 1301, a third reference unit 1302, a second sense amplifier SA2, and a third sense amplifier SA3 and an output unit 1303.

The second reference unit 1301 is used to provide a second reference voltage Vref2 when performing a read operation on the storage array 1201 or when performing a logical OR operation on the storage array 1201. In some embodiments, the second reference unit 1301 includes a second reference resistor Rref2, a third reference resistor Rref3, a third transistor Q3 and a fourth transistor Q4. One end of the second reference resistor Rref2 is connected to one end of the third reference resistor Rref3 and one input end of the second sense amplifier SA2, and is used to receive a second reference current Iref2; another end of the second reference resistor Rref2 is connected to one end of the third transistor Q3, another end of the third reference resistor Rref3 is connected to one end of the fourth transistor Q4; and a control end of the third transistor Q3 is used to receive a first enable signal EN1, a control end of the fourth transistor Q4 is used to receive a second enable signal EN2, and another end of the third transistor Q3 and another end of the fourth transistor Q4 are grounded.

The third reference unit 1302 is used to provide a third reference voltage Vref3 when performing a logical AND operation on the storage array 1201. In some embodiments, the third reference unit 1302 includes a fourth reference resistor Rref4 and a fifth transistor Q5. One end of the fourth reference resistor Rref4 is connected to one input end of the third sense amplifier SA3, and is used to receive a third reference current Iref3, and another end of the fourth reference resistor Rref4 is connected to one end of the fifth transistor Q5. A control end of the fifth transistor Q5 is used to receive the third enable signal EN3, and another end of the fifth transistor Q5 is grounded.

One input end of the second sense amplifier SA2 is used to receive the second reference voltage Vref2, another input end of the second sense amplifier SA2 is connected to the M read bit lines, and an output end of the second sense amplifier SA2 is connected to the output unit 1303. The second sense amplifier SA2 compares the voltage on the M read bit lines with the second reference voltage Vref2, and outputs data stored in a selected storage cell according to the comparison result, or outputs an operation result of a logical OR operation performed on a selected column of storage cells.

One input end of the third sense amplifier SA3 is used to receive the third reference voltage Vref3, and another input end of the second third sense amplifier SA3 is connected to the M read bit lines, and an output end of the third sense amplifier SA3 is connected to the output unit 1303. The third sense amplifier SA3 compares a voltage on the M read bit lines with the third reference voltage Vref3, and outputs an operation result of a logical AND operation performed on a selected column of storage cells according to the comparison result.

An output end of the output unit 1303 serves as an output end of the in-memory computing circuit. The output unit 1303 is used to shape data output by the second sense amplifier SA2 and the third sense amplifier SA3, and output binary data "0" or binary data "1".

When performing a read operation on the storage array 1201, the first enable signal EN1 controls the third transistor Q3 to turn on, and the second enable signal EN2 controls the fourth transistor Q4 to turn off, and the third enable signal EN3 controls the fifth transistor Q5 to turn off, and the second reference current Iref2 flows through the second reference resistor Rref2 to generate the second reference voltage Vref2. The setting of the resistance value of the second reference resistor Rref2 can refer to the foregoing description of a read operation on the SOT-MRAM storage cell, which is not repeated herein.

When performing a logical OR operation on the storage array 1201, the first enable signal EN1 controls the third transistor Q3 to turn off, and the second enable signal EN2 controls the fourth transistor Q4 to turn on, and the third enable signal EN3 controls the fifth transistor Q5 to turn off, and the second reference current Iref2 flows through the third reference resistor Rref3 to generate the second reference voltage Vref2. The setting of the resistance value of the third reference resistor Rref3 can refer to the foregoing description of performing a logical OR operation on two binary data, which will not be repeated herein.

When performing a logical AND operation on the storage array 1201, the first enable signal EN1 controls the third transistor Q3 to turn off, the second enable signal EN2 controls the fourth transistor Q4 to turn off, the third enable signal EN3 controls the fifth transistor Q5 to turn on, and the third reference current Iref3 flows through the fourth reference resistor Rref4 to generate the third reference voltage Vref3. The setting of the resistance value of the fourth reference resistor Rref4 can refer to the foregoing description of performing a logical AND operation on two binary data, which will not be repeated herein.

The third transistor Q3, the fourth transistor Q4 and the fifth transistor Q5 may be NMOS transistors. One end of the third transistor Q3, one end of the fourth transistor Q4 and one end of the fifth transistor Q5 are the drains of the NMOS transistors; and another end of the third transistor Q3, another end of the fourth transistor Q4 and another end of the fifth transistor Q5 are the sources of the NMOS transistors. A control end of the third transistor Q3, a control end of the fourth transistor Q4 and a control end of the fifth transistor Q5 are gates of NMOS transistors. Of course, the third transistor Q3, the fourth transistor Q4 and the fifth transistor Q5 may also be other transistors with switching functions, which is not limited in the disclosure.

In some embodiments, the read operation module 1205 may further include a NAND circuit and a NOT circuit. One input end of the NAND circuit is connected to an output end of the second sense amplifier SA2, and another input end of the NAND circuit is connected to an output end of the third sense amplifier SA3, and an output end of the NAND circuit is connected to the output unit 1303 and an input end of the NOT circuit, and an output end of the NOT circuit is connected to the output unit 1303. Output signals of the second sense amplifier SA2 and the third sense amplifier SA3 can implement XOR and XOR operations through the NAND circuit and the NOT circuit.

It should be noted that the second sense amplifier SA2 and the third sense amplifier SA3 may be single-ended output type or double-ended output type. When the second sense amplifier SA2 and the third sense amplifier SA3 are double-ended output type, the output end of the second sense amplifier SA2 and the output end of the third sense amplifier SA3 both refer to the in-phase output ends of the double-ended output, or both refer to the inverting output ends of the double-ended output.

The in-memory computing circuit of one or more embodiments of the disclosure can realize the access of the storage array and the Boolean logic operation of the stored data, achieve the in-memory computing function, and is compatible with the existing CMOS integrated circuit technology and is conducive to large-scale manufacture and integration applications.

The above are only the embodiments of the disclosure and are not used to limit the scope of protection of the disclosure. Any modifications, equivalent replacements and improvements made within the spirit and principle of the disclosure shall all be covered by the protection scope of this disclosure.

The invention claimed is:

1. A spintronic device, comprising a ferroelectric/ferromagnetic heterostructure, a magnetic tunnel junction and a heavy metal layer disposed between the ferroelectric/ferromagnetic heterostructure and the magnetic tunnel junction; the ferroelectric/ferromagnetic heterostructure includes a multiferroic material layer and a ferromagnetic layer arranged in a stacked manner, and the magnetic tunnel junction includes a free layer, an insulating layer, and a reference layer arranged in a stacked manner, and the heavy metal layer is disposed between the ferromagnetic layer and the free layer.

2. The spintronic device according to claim 1, wherein a material of the multiferroic material layer is LaxBi1-xFeO3 or BiFeO3, and a material of the ferromagnetic layer is CoFe.

3. The spintronic device according to claim 1, wherein a material of the heavy metal layer is W, Pt or Ta.

4. The spintronic device according to claim 1, wherein a material of the free layer is one of FeCo, FeNi, FePd, FePt, CoPd, and FeCoB or a Heusler compound, a material of the insulating layer is MgO or AlOx, and a material of the reference layer is one of FeCo, FeNi, FePd, FePt, CoPd, and FeCoB or a Heusler compound.

5. The spintronic device according to claim 1, wherein the ferroelectric/ferromagnetic heterostructure and the magnetic tunnel junction are both cylindrical structures, and the heavy metal layer is a strip-shaped structure.

6. The spintronic device according to claim 5, further including a first electrode, a second electrode, a third electrode and a fourth electrode;
the first electrode is connected to the multiferroic material layer, and the second electrode is connected to the reference layer, and the third electrode is connected to an end of the heavy metal layer, and the fourth electrode is connected to another end of the heavy metal layer; an end of the heavy metal layer and another end of the heavy metal layer are oppositely arranged.

7. An in-memory computing circuit, comprising a first storage cell, a second storage cell, a first reference unit and a first sense amplifier, the first storage cell and the second storage cell being a SOT-MRAM storage cells;
the first reference unit is used to provide a first reference voltage, and an input end of the first sense amplifier is used to receive the first reference voltage, and another input end of the first sense amplifier is connected to a read bit line connected to the first storage cell and a read bit line connected to the second storage cell, and an output end of the first sense amplifier is used as an output end of the in-memory computing circuit; and
the SOT-MRAM storage cell includes a first transistor, a second transistor, and the spintronic device as claimed in claim 1;
an end of the first transistor and the multiferroic material layer are used to connect a write bit line, and another end of the first transistor is connected to an end of the heavy metal layer, and a control end of the first transistor is used to connect a write word line;
an end of the second transistor is used to connect a read bit line, and another end of the second transistor is connected to the reference layer, and a control end of the second transistor is used to connect a read word line; and
another end of the heavy metal layer is used to connect a source line, another end of the heavy metal layer and an end of the heavy metal layer being oppositely arranged.

8. The in-memory computing circuit according to claim 7, wherein the first reference unit includes a first reference resistor;
an end of the first reference resistor is connected to an input end of the first sense amplifier and used to receive a first reference current, and another end of the first reference resistor is grounded.

9. The in-memory computing circuit according to claim 7, wherein the first storage cell and the second storage cell are connected to a same write word line, and the first storage cell and the second storage cell are connected to a same source line, and the first storage cell and the second storage cell are connected to a same read bit line.

10. An in-memory computing circuit, comprising a bit line decoder, a word line decoder, a source line decoder, a read operation module and a storage array;
the storage array includes M write bit lines, M read bit lines, N write word lines, N read word lines, N source lines, and M rows and N columns of storage cells, wherein the storage cells are the SOT-MRAM storage cells as claimed in claim 1, M and N being positive integers; and
each storage cell located in a same row is connected to a same write bit line, and each storage cell located in a same row is connected to a same read bit line, and each storage cell located in a same column is connected to a same write word line, and each storage cell located in a same column is connected to a same read word line, and each storage cell located in a same column is connected to a same source line;
the bit line decoder is used to provide a bit line operation voltage to the M write bit lines and the M read bit lines;
the word line decoder is used to provide a word line operation voltage to the N write word lines and the N read word lines;
the source line decoder is used to provide a source line operation voltage and an induced current to the N source lines; and
the read operation module is used to read data stored in the storage array and perform a logical operation on the data stored in the storage array.

11. The in-memory computing circuit according to claim 10, wherein the read operation module includes a second reference unit, a third reference unit, a second sense amplifier, a third sense amplifier, and an output unit;
the second reference unit is used to provide a second reference voltage when performing a read operation on the storage array or when performing a logical OR operation on the storage array;
the third reference unit is used to provide a third reference voltage when performing a logical AND operation on the storage array;
an input end of the second sense amplifier is used to receive the second reference voltage, and another input end of the second sense amplifier is connected to the M read bit lines, and an output end of the second sense amplifier is connected to the output unit;
an input end of the third sense amplifier is used to receive the third reference voltage, and another input end of the third sense amplifier is connected to the M read bit lines, and an output end of the third sense amplifier is connected the output unit; and
an output end of the output unit is used as an output end of the in-memory computing circuit.

12. The in-memory computing circuit according to claim 11, wherein the second reference unit includes a second reference resistor, a third reference resistor, a third transistor, and a fourth transistor;
an end of the second reference resistor is connected to an end of the third reference resistor and an input end of the second sense amplifier and is used to receive a second reference current, and another end of the second reference resistor is connected to an end of the third transistor, and another end of the third reference resistor is connected to an end of the fourth transistor, and a control end of the third transistor is used to receive a first enable signal, and a control end of the fourth transistor is used to receive a second enable signal, and another end of the third transistor and another end of the fourth transistor are grounded.

13. The in-memory computing circuit according to claim 11, wherein the third reference unit includes a fourth reference resistor and a fifth transistor;

an end of the fourth reference resistor is connected to an input end of the third sense amplifier and used to receive a third reference current, and another end of the fourth reference resistor is connected to an end of the fifth transistor, and a control end of the fifth transistor is used to receive a third enable signal, and another end of the fifth transistor is grounded.

14. The in-memory computing circuit according to claim 11, wherein the read operation module further includes a NAND circuit and a NOT circuit;

an input end of the NAND circuit is connected to an output end of the second sense amplifier, and another input end of the NAND circuit is connected to an output end of the third sense amplifier, and an output end of the NAND circuit is connected to the output unit and an input end of the NOT circuit, and an output end of the NOT circuit is connected to the output unit.

\* \* \* \* \*